United States Patent [19]
Vagher

[11] Patent Number: 5,507,036
[45] Date of Patent: Apr. 9, 1996

[54] APPARATUS WITH DISTORTION CANCELLING FEED FORWARD SIGNAL

[75] Inventor: Michael R. Vagher, Cedar Rapids, Iowa

[73] Assignee: Rockwell International, Seal Beach, Calif.

[21] Appl. No.: 316,285

[22] Filed: Sep. 30, 1994

[51] Int. Cl.⁶ .................................................. H04B 1/10
[52] U.S. Cl. .......................... 455/295; 455/304; 455/312; 455/324; 455/326
[58] Field of Search ..................................... 455/295, 296, 455/302, 303, 304, 306, 307, 310, 313, 317, 323, 324, 326, 333, 312; 381/13; 332/145; 333/177; 375/99

[56] References Cited

U.S. PATENT DOCUMENTS

| | | | |
|---|---|---|---|
| 3,646,461 | 2/1972 | Modafferi | 455/307 |
| 3,961,264 | 6/1976 | Hekimian et al. | 455/313 |
| 3,996,537 | 12/1976 | Neuman | 333/177 |
| 4,408,352 | 10/1983 | Dudding | 455/295 |
| 4,501,004 | 2/1985 | Yoshida et al. | 455/304 |
| 4,718,113 | 1/1988 | Rother et al. | 455/302 |
| 4,751,734 | 6/1988 | Rucktenwald | 381/13 |
| 4,811,425 | 3/1989 | Feerst | 455/317 |
| 4,817,198 | 3/1989 | Rinderle | 455/249 |
| 4,926,132 | 5/1990 | Main | 329/318 |
| 4,926,499 | 5/1990 | Kobayashi et al. | 455/302 |
| 5,052,050 | 9/1991 | Collier et al. | 455/296 |
| 5,161,254 | 11/1992 | Braathen | 455/306 |
| 5,179,730 | 1/1993 | Loper | 455/324 |
| 5,363,195 | 11/1994 | Ward et al. | 332/145 |
| 5,369,794 | 11/1994 | Martineau | 455/304 |

*Primary Examiner*—Andrew I. Faile
*Attorney, Agent, or Firm*—Kyle Eppele; M. Lee Murrah; G. A. Montanye

[57] ABSTRACT

An apparatus and a method for cancelling distortion in a direct conversion receiver, such distortion created by the mixing of the desired signal with the output signal of an local oscillator. Subsequent to filtering the mixer output signal, the even mode distortion component is extracted, phase shifted, amplified and recombined with the mixed signal in such manner as to suppress even order distortion.

7 Claims, 4 Drawing Sheets

APPARATUS WITH DISTORTION CANCELLING FEED FORWARD SIGNAL

BACKGROUND OF THE INVENTION

The present invention relates to electronic circuits and more particularly to electronic circuits using open loop control signals to minimize distortion.

Conventional mixers are widely used in a variety of electronic circuitry such as radios, cellular telephones or other devices, requiring the product of two waveform signals. Such mixers typically produce an output signal at a frequency that is the sum, or difference, of the two incoming signal frequencies. This output signal or "mixed" signal undergoes further processing to demodulate the desired data that is typically modulated on one of the signals. Prior art mixers can produce output signals having undesired components including direct current ("DC") caused by a non-linear response of the mixer. An ideal mixer would form the product of two signals and not have these secondary non-linear responses. Some applications are less tolerant of accommodating such undesired signal components.

A direct conversion receiver ("DCR") is one such application where undesired signals from the mixer can render the receiver non-functioning. Typically, a DCR uses a balanced mixer that receives a radio frequency ("RF") signal and a local oscillator signal. The local oscillator and RF signal are at the same frequency and therefore the modulation on the RF signal is converted directly to baseband. In the presence of a strong applied RF signal which is off-channel or an undesired interfering signal, the second order distortion component in the non-linear device which comprises the mixer causes a second harmonic and also creates a DC with an unmodulated RF signal, or a conversion of the modulated signal to baseband with a carrier signal that is amplitude modulated. Since the desired RF signal is also converted to zero IF and the modulation to baseband, this can interfere with the desired signal. This problem is often referred to as a spurious demodulation phenomena or direct detection. The undesired RF signal is directly detected or demodulated through second order distortion, not through mixing action, and thus is demodulated (if signal is strong) regardless of signal frequency.

SUMMARY OF THE INVENTION

The present invention comprises an apparatus and method that minimizes signal distortion in a processed modulated radio signal by use of a feed forward correction signal generated and determined beyond the mixer stage of the receiver. In one embodiment of the present invention an RF input signal is mixed with the output of a local oscillator and subsequently converted to a voltage equivalent, the signal may then be passed through a low pass filter. An even mode distortion extractor is coupled to the output of the low pass filter. The extractor also receives a reference input signal and generates as its output, a signal that contains even order distortion. This output signal is then phase shifted and coupled to a summer which combines the correction signal to the signal that is generated by the low pass filter. It is worth noting, that unlike numerous prior art solutions the present invention generates a correction signal and implements the same signal at a point in the processing stage beyond the mixer.

It is an object of the present invention to provide a radio receiver having improved reception qualities due to increased distortion suppression.

It is a feature of the present invention to utilize a feed forward correction signal based upon an even mode distortion extraction technique.

It is an advantage of the present invention that a desired component of a process signal can be effectively separated from an undesired component thereby yielding a superior output value.

These and other objects, features and advantages are disclosed and claimed in the specification, figures and claims of the present application.

DESCRIPTION OF THE PREFERRED EMBODIMENT

Figure 1:
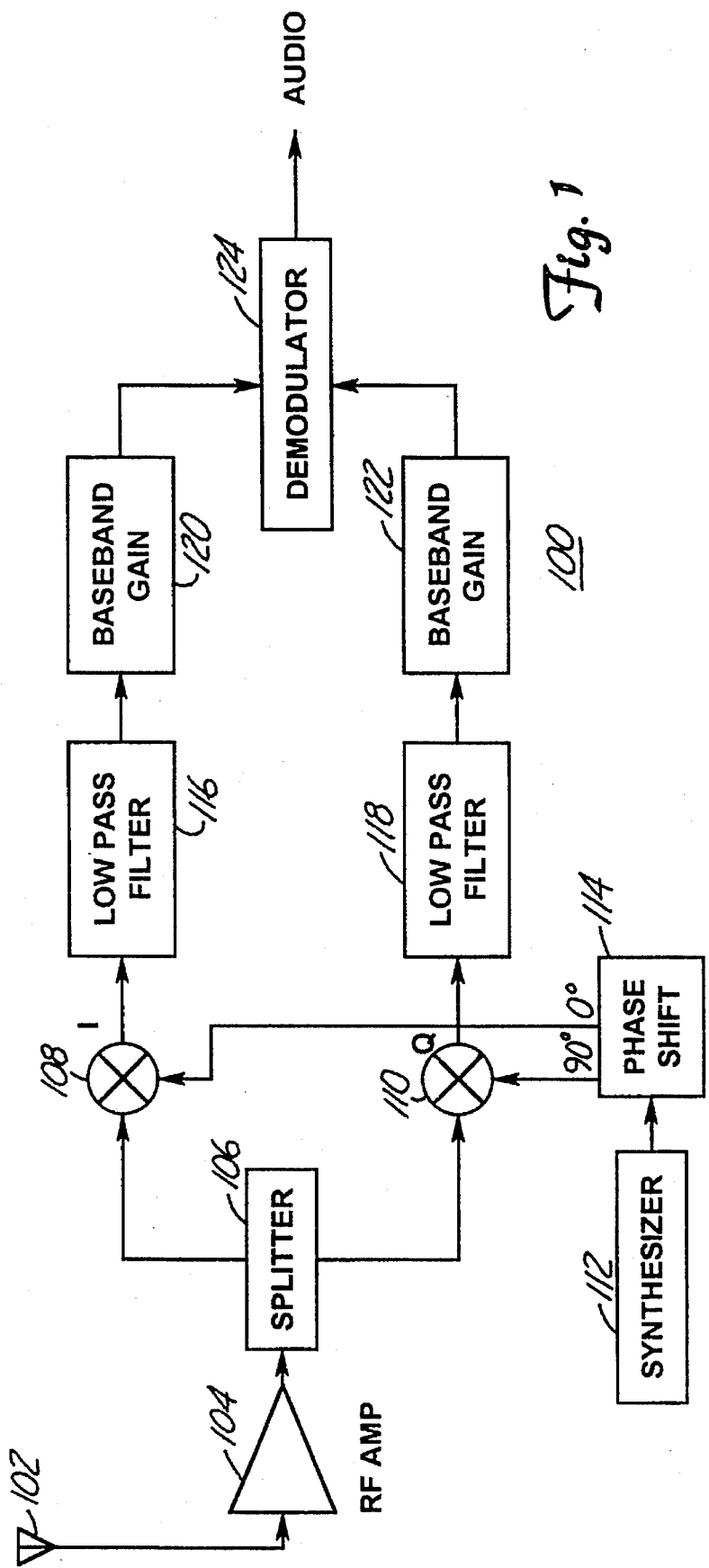
FIG. 1 is a block diagram of a direct conversion receiver capable of incorporating the teachings of the present invention.

Referring now to the Figures, wherein like numbers are referenced as such throughout, FIG. 1 illustrates a direct conversion receiver 100 capable of benefiting from the teachings of the present invention. The receiver 100 would typically include an RF amplifier 104 and a splitter 106 for dividing an incoming RF communication signal into a pair of equal and inphase components. The RF signal components are combined at the mixers 108, 110 with separate injection signals on frequency with the communications signal but separated by a phase difference of 90°. Inphase and quadrature baseband signal components are formed which are independently filtered and amplified at audio frequencies on separate signal channels by separate filters 116, 118 and amplifiers 120, 122. The inphase and quadrature components formed as a result of the mixing process allow the signal to be conveniently and accurately demodulated upon being supplied to a suitable signal processing unit 124 such as a demodulator.

Figure 2:
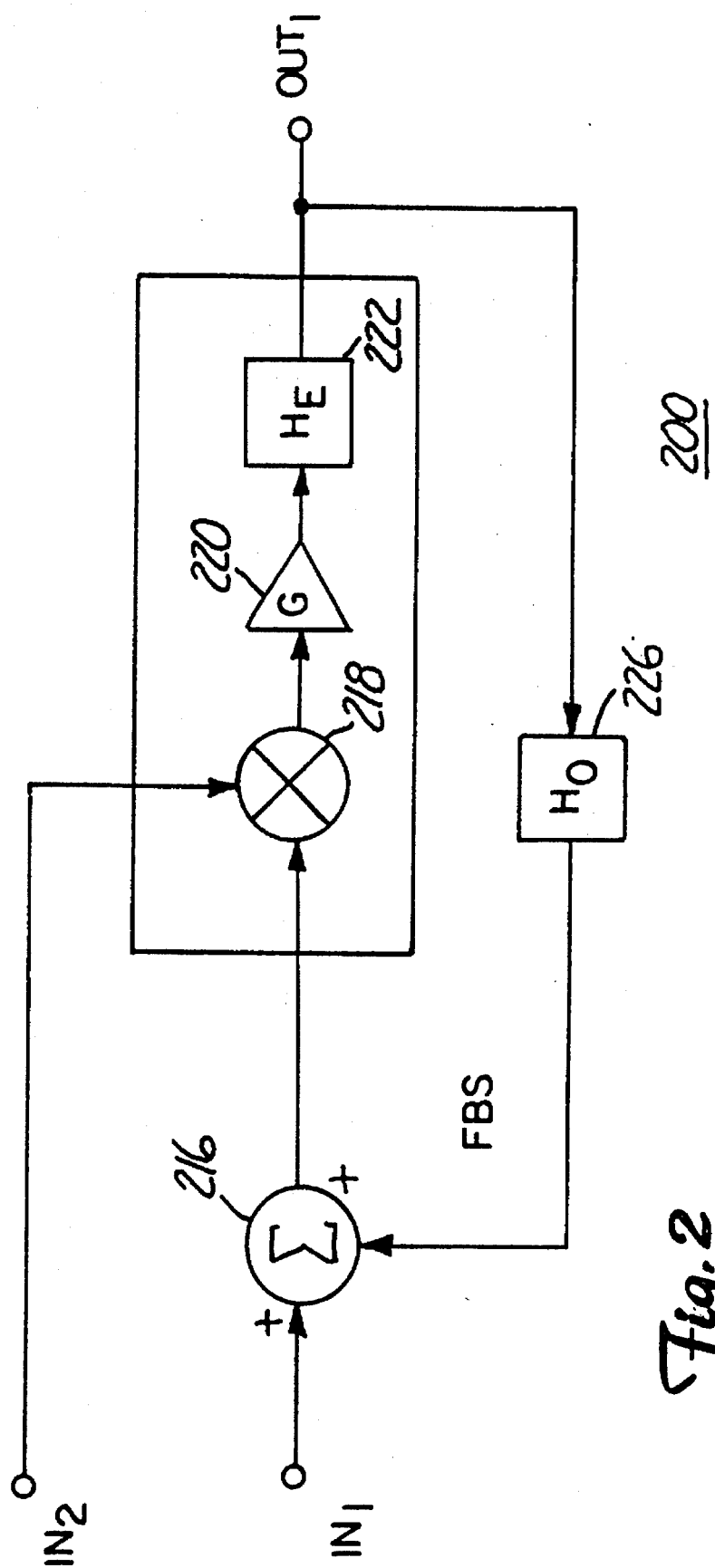
FIG. 2 is a block diagram of a prior art feed back mixer.

FIG. 2 shows an active filtering mixer 200 as known in the prior art. A first input signal $IN_1$ is coupled to a summer 216, the output signal of the summer 216 is coupled to a multiplier 218, the multiplier 218 also receives a second input signal $IN_2$ thereby performing the mixing of the signals $IN_1$ and $IN_2$. The output signal of the multiplier 218 is coupled through an amplifier 220 whose output signal is in turn coupled through a high pass filter 222 thereby yielding an output signal $OUT_1$. The output signal is also coupled in feedback fashion to the summer unit 216 via feedback selection means 226. The feedback selection means 226 filters or amplifies dependent upon the specified application to produce a feedback signal FBS which is coupled to summer 216.

The output of the multiplier 218 can be considered to have a desired component, and superimposed thereon an unwanted component. The feedback signal generated in feedback means 226 is a function of the signal components. Application of the feedback signal FBS to the multiplier 218 causes an unwanted component of its output to be largely suppressed. This result is obtained due to the multiplier 218 generating in its output a cancellation signal that suppresses the unwanted component.

Figure 3:
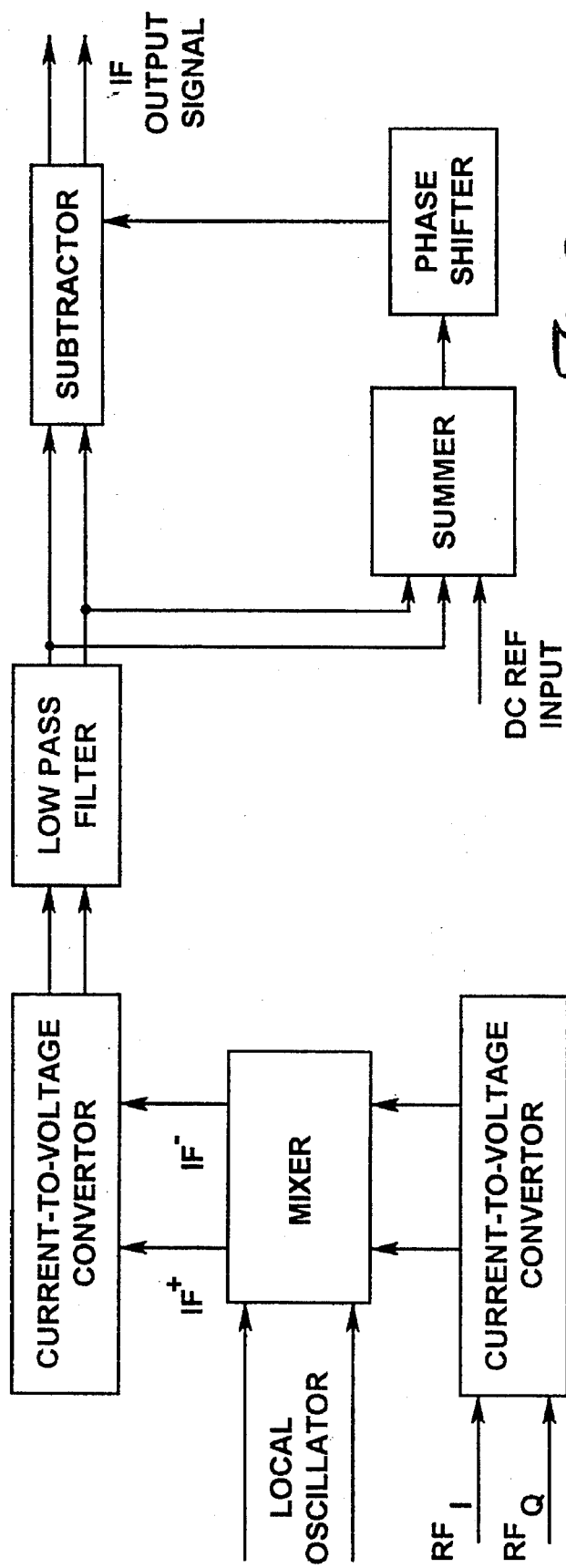
FIG. 3 is a block diagram of the teachings of the present invention.

FIG. 3 illustrates a block diagram of a portion of an RF receiver that implements the teachings of the present invention. An RF input signal $RF^+$, $RF^-$ is shown coupled to a voltage-to-current converter 302. The output signals of the converter 302 are coupled to a mixer 304 which combines the current RF signal with an input signal from a local oscillator. The mixed signals $IF^+$ and $IF^-$ are then coupled to a current-to-voltage converter 306, then in turn coupled to a balanced low pass filter 308. The output signals of the filter 308 are coupled to a subtractor 310 and an extractor 312. The extractor also receives a reference input signal from a DC source illustrated as $DC_r$. The extractor generates a signal that is then coupled through a phase shifter 314 and combined with the output of the filter 308 at the subtractor 310. The output signals of the subtractor 310 are then coupled to additional processing means not shown.

Figure 4:
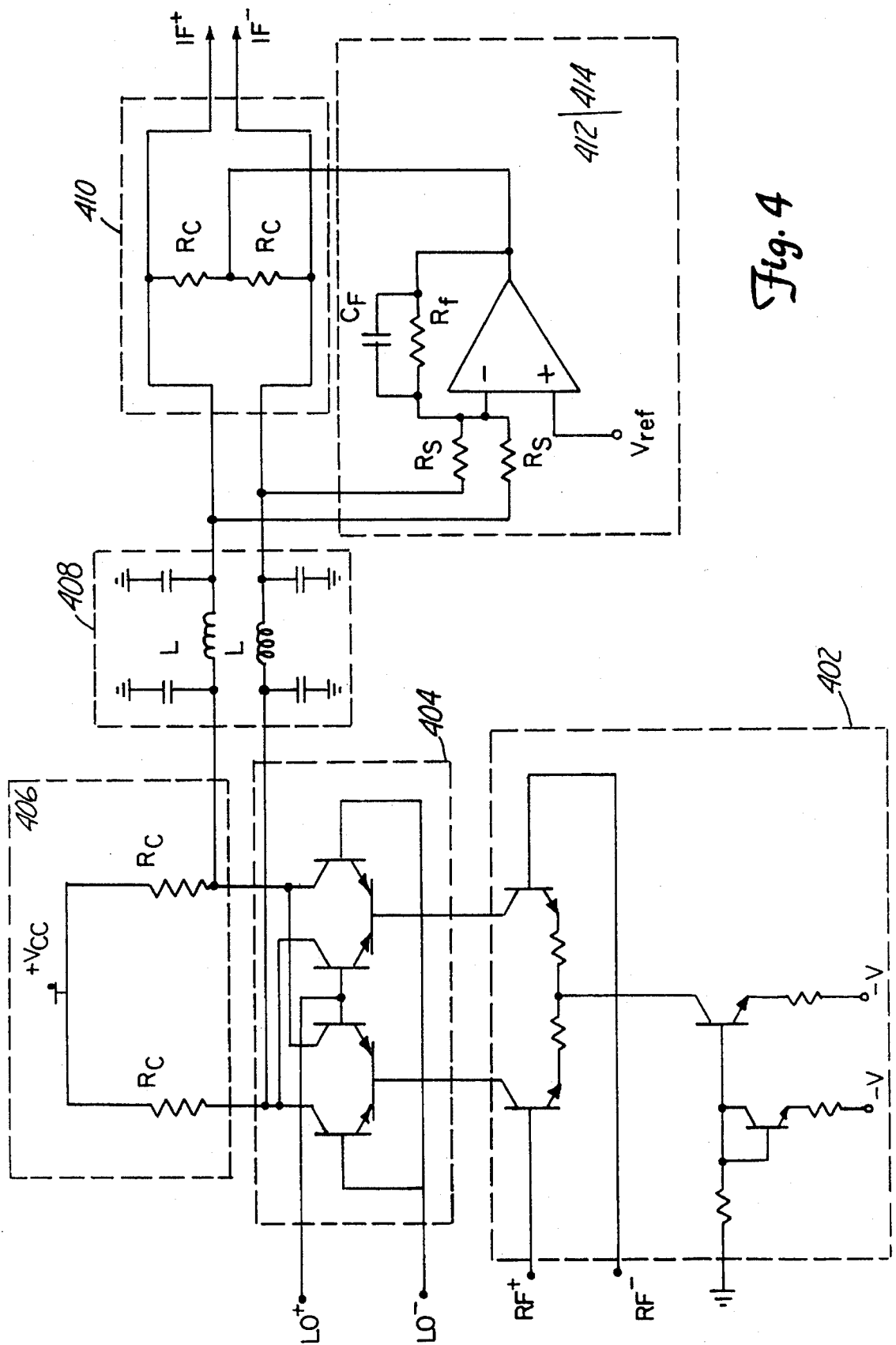
FIG. 4 is a schematic diagram of a mixer utilizing the teachings of the present invention.

FIG. 4 illustrates the block diagram of FIG. 3 in schematic format having the blocks superimposed upon the schematic in dashed manner. The Applicant has adhered to conventional electrical symbology for resistors, transistors, capacitors and inductors in presenting the schematic of FIG. 4. The operation of the apparatus of FIGS. 3 and 4 will now be described in detail. The voltage-to-current converter 402, the mixer 404, and the current-to-voltage converter 406 may all be implemented in commercially available active mixers manufactured in accordance with well known integrated circuit techniques. The mixer 404 and the low pass filter 408 are in a balanced signal format and must remain so through the rest of the circuit. The filter 408 provides an output signal that contains the desired signal in a DCR application (voice frequency) and may also contain distortion from a strong off-channel undesired signal if present. A critical part of this invention is the use of the difference between the desired signal and distortion. If a strong off-channel or adjacent channel signal is present, the modulation on this signal will be converted to a "baseband" signal through the distortion mechanism of the mixer 404. The baseband frequency range is usually the same as that of the desired signal. The off-channel signal is not converted to baseband by "mixing" action as is the desired signal. However, it is converted by a "square law" distortion present in the mixer that has behavior much like a diode detector. Therefore, any demodulation of an undesired signal depends not on its frequency but signal strength. Thus an important aspect of this invention is that signal distortion caused by "second order" nonlinearity exists in the mixer 404 in a common-mode form while the desired signal exists in a balanced form.

The distortion and desired signal are not separated in frequency, thus the common-mode, balanced mode difference is the only discriminator easily detected between the two signal components. The conversion from balanced signal to single ended signal will ideally cancel all common-mode signals, thereby rejecting the distortion component of the signal. However, in actuality the rejection is typically on the order of 20 decibels to 30 decibels yielding unacceptable results in DCRs. The distortion component of the output of the balanced low pass filter 408 is best coupled to an extractor 412, which in actuality is a summer device. This will add the distortion component on each balanced output while cancelling the desired signal component an appreciable amount. The output signal of the extractor 412 is now principally composed of the second order distortion component of the input signal. It is then amplified and phase shifted by 180°. The output signal of the amplifier and phase shifter 414 is then subtracted from the output of filter 408 by device 410. This is accomplished by applying the output signal of the phase shift device 414 to the midpoint of two resistors of equal value as shown in FIG. 4. By injecting the signal at this point, only the common-mode component of the signal is effected. The Applicant refers to this approach as a feed-forward cancellation because the distortion is cancelled at a point beyond the mixer 404, where it is generated. It is noted that feed back is used at the actual point of distortion cancellation. The distortion component is amplified by the operational-amplifier shown in FIG. 4 in accordance with the value $R_f/R_s$. The use of the capacitor $C_f$ provides loop stability. The resultant distortion component signal is then applied to a common-mode subtractor 410. This then diminishes the distortion that is available to the input of the operational-amplifier. The level of distortion reduction will depend on the value $R_f/R_s$ which can be chosen high enough to reduce the distortion to negligible levels. It is assumed but not shown in the schematics that the IF signal is subsequently converted to a single ended signal.

The above described technique and apparatus will not cancel distortion in a mixer caused by odd-order non-linearities. For this reason the teachings of this application are deemed to be application specific to DCRs where even order distortions (second order being dominant) present a major problem.

Those skilled in the art will readily recognize that various modifications and changes may be made to the present invention without departing from the true spirit and scope thereof, which is set forth in the following claims.

I claim:

1. An apparatus for common-mode extraction of even mode non-linear distortion in a direct conversion receiver, comprising:

a mixer that combines an RF input signal with an output signal of a local oscillator;

a balanced low-pass filter coupled to an output signal of the mixer;

an even mode distortion extractor coupled to an output signal of the balanced low-pass filter;

an amplifier coupled to an output signal of the extractor;

a phase shifter coupled to the amplifier; and a subtractor coupled to the balanced low-pass filter and the phase shifter;

wherein the distortion generated by the mixer is extracted by the even mode extractor and applied to the desired signal of the subtractor thereby suppressing distortion.

2. The apparatus of claim 1 wherein the balanced low-pass filter is comprised of a pair of pi filters.

3. The apparatus of claim 1 wherein the subtractor is comprised of a pair of evenly balanced resistors.

4. The apparatus of claim 1 wherein the even mode distortion extractor and the phase shifter are implemented as part of an operational amplifier.

5. A method for suppressing distortion in a direct conversion receiver comprising the following steps:

converting a balanced RF input signal into a balanced current signal;

mixing the current signal with an output signal of a local oscillator;

converting the mixed current and local oscillator signals into a voltage signal;

filtering the converted voltages signal;

extracting a distortion component of the voltage signal;

phase-shifting the distortion component of the voltage signal; and subtracting the phase-shifted distortion component of the voltage signal from the filtered converted voltage signal.

6. The method of claim 5 wherein the distortion component of the voltage signal is an even-mode component.

7. The method of claim 5 wherein distortion component of the voltage signal is phase-shifted one hundred eighty degrees.

* * * * *